(12) United States Patent
Matsui

(10) Patent No.: US 9,303,841 B2
(45) Date of Patent: Apr. 5, 2016

(54) ULTRAVIOLET LIGHT-EMITTING MODULE AND ULTRAVIOLET IRRADIATION DEVICE

(71) Applicant: Tokuyama Corporation, Yamaguchi (JP)

(72) Inventor: Shingo Matsui, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 14/436,354

(22) PCT Filed: Oct. 24, 2013

(86) PCT No.: PCT/JP2013/006283
§ 371 (c)(1),
(2) Date: Apr. 16, 2015

(87) PCT Pub. No.: WO2014/068912
PCT Pub. Date: May 8, 2014

(65) Prior Publication Data
US 2015/0247615 A1    Sep. 3, 2015

(30) Foreign Application Priority Data
Oct. 30, 2012  (JP) .................................. 2012-239519

(51) Int. Cl.
*C02F 1/32*     (2006.01)
*F21V 7/00*    (2006.01)
(Continued)

(52) U.S. Cl.
CPC .................. *F21V 7/0066* (2013.01); *F21V 3/04* (2013.01); *F21V 7/005* (2013.01); *F21V 7/045* (2013.01);
(Continued)

(58) Field of Classification Search
USPC ....... 250/504 R, 455.11, 432 R, 435; 422/24, 422/22, 186.3
See application file for complete search history.

(56) References Cited

U.S. PATENT DOCUMENTS 8,324,595 B2 * 12/2012 Takahashi .............. A01K 63/04
                                                            210/748.11
2009/0294688 A1 * 12/2009 Evans ....................... A23L 3/28
                                                            250/436

(Continued)

FOREIGN PATENT DOCUMENTS

JP    2004-006377 A    1/2004
JP    2005-203481 A    7/2005

(Continued)

OTHER PUBLICATIONS

International Search Report in International Application No. PCT/JP2013/006283, filed Oct. 24, 2015.

*Primary Examiner* — Kiet T Nguyen
(74) *Attorney, Agent, or Firm* — Saliwanchik, Lloyd & Eisenschenk

(57) ABSTRACT

Provided is a compact ultraviolet irradiation apparatus using ultraviolet light-emitting devices such as ultraviolet LEDs that can irradiate high intensity ultraviolet rays. This ultraviolet irradiation apparatus including a light source for emitting ultraviolet rays; and a light condenser for condensing the ultraviolet rays emitted from the light source, the light source is a modularized rod-like light source (110) where a plurality of ultraviolet light-emitting devices is disposed on a side surface of a cylindrical or polygonal columnar base such that a light axis of each ultraviolet light-emitting device passes through a center axis of the cylindrical or polygonal columnar base to emit the ultraviolet rays radially to the center axis, the rod-like light source is disposed on a focal axis (121) of a long elliptical reflective mirror (120) to condense ultraviolet rays radially emitted from the rod-like light source, and the condensed ultraviolet rays are irradiated.

9 Claims, 2 Drawing Sheets

(51) Int. Cl.
  *F21V 7/08* (2006.01)
  *F21V 29/50* (2015.01)
  *F21V 3/04* (2006.01)
  *F21V 7/04* (2006.01)
  *F21V 31/00* (2006.01)
  *H01L 25/075* (2006.01)
  *H01L 33/64* (2010.01)
  *F21V 29/00* (2015.01)
  *F21Y 101/02* (2006.01)

(52) U.S. Cl.
  CPC . *F21V 7/08* (2013.01); *F21V 29/50* (2015.01); *F21V 31/005* (2013.01); *F21V 29/30* (2013.01); *F21Y 2101/02* (2013.01); *H01L 25/0753* (2013.01); *H01L 33/648* (2013.01); *H01L 2924/0002* (2013.01)

(56) References Cited

U.S. PATENT DOCUMENTS

2010/0253226 A1  10/2010  Oki
2011/0290179 A1  12/2011  Stowell et al.
2015/0284266 A1*  10/2015  Matsui ................ C02F 1/325
                                          422/24

FOREIGN PATENT DOCUMENTS

| JP | 2009-098381 A | 5/2009 |
| JP | 2010-110938 A | 5/2010 |
| JP | 2010-245018 A | 10/2010 |
| JP | 2011-253808 A | 12/2011 |
| JP | 2012-151078 A | 8/2012 |
| JP | 3179165 U | 10/2012 |
| WO | WO-2010/058607 A1 | 5/2010 |

* cited by examiner

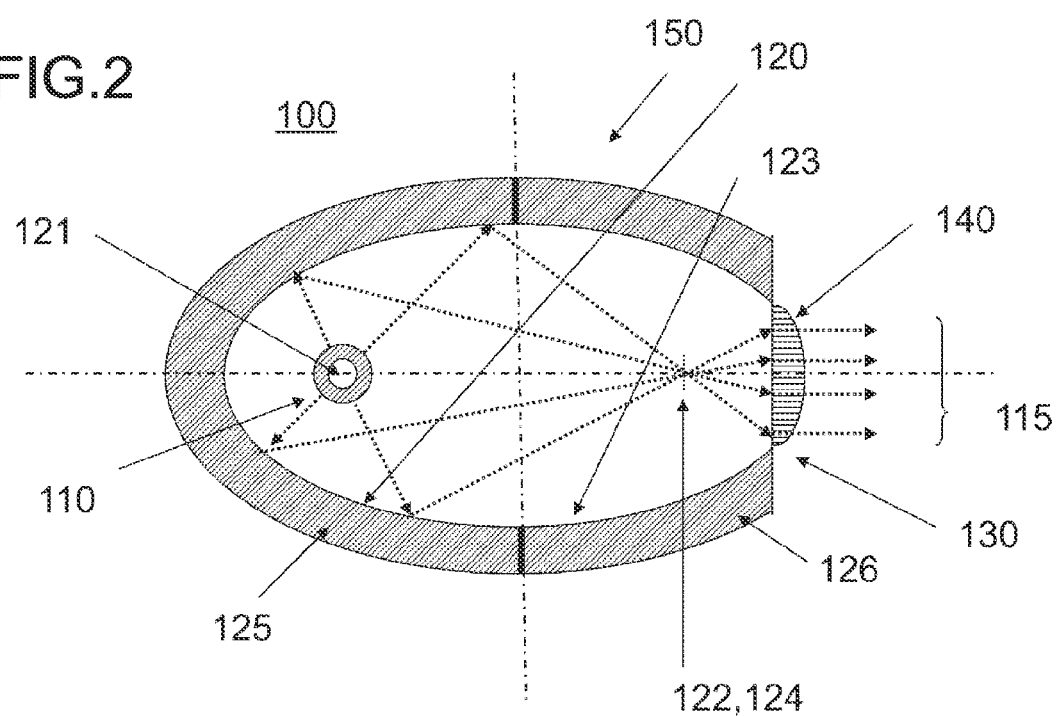
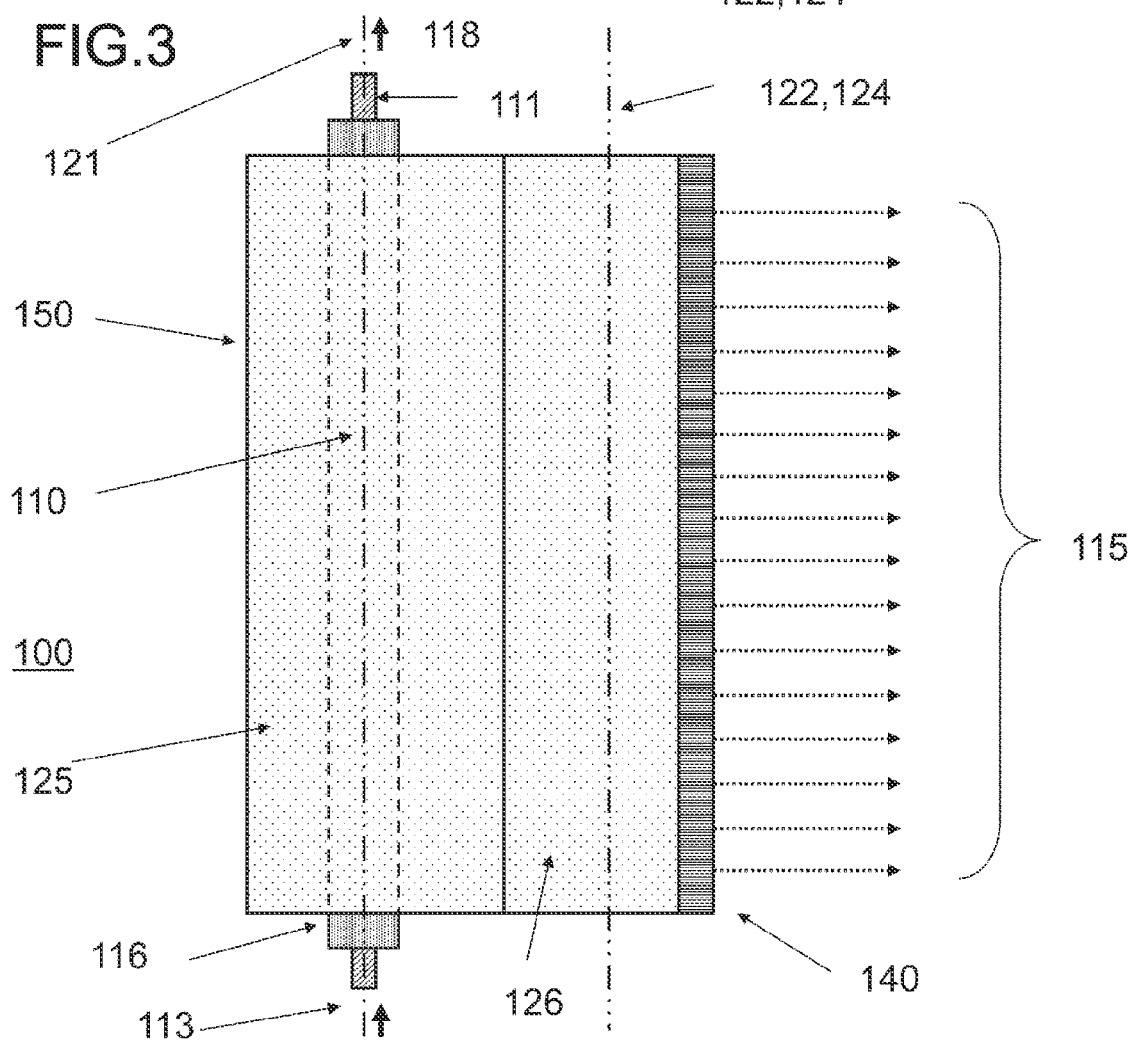

ULTRAVIOLET LIGHT-EMITTING MODULE AND ULTRAVIOLET IRRADIATION DEVICE

CROSS-REFERENCE TO RELATED APPLICATIONS

This application is the U.S. national stage application of International Patent Application No. PCT/JP2013/006283, filed Oct. 24, 2013, which claims priority to Japanese Application No. 2012-239519, filed Oct. 30, 2012, the disclosures of each of which are incorporated herein by reference in their entirety.

TECHNICAL FIELD

The present invention relates to a novel ultraviolet light-emitting module and a novel ultraviolet irradiation apparatus using the ultraviolet light-emitting module.

BACKGROUND ART

As a light source for an ultraviolet irradiation apparatus used in a backlight illumination, photo-curing of an ultraviolet curing resin, sterilization, cleaning, a production process of a semiconductor, etc., a discharge lamp of high-pressure mercury, metal halide, or xenon has been mainly used in the related art. Light emitted from the light source composed of the discharge lamp include not only an ultraviolet region but also a wide range of wavelength regions from deep ultraviolet to far infrared. Therefore, in order to inhibit a temperature increase in an irradiated area or utilize needed ultraviolet rays effectively, a cold filter is necessary.

In contrast, an ultraviolet light-emitting diode (hereinafter referred to as "ultraviolet LED") is characterized in that the ultraviolet rays having specified wavelengths can be emitted selectively. Therefore, the cold filer may not be used. However, an emission intensity (UV intensity) of the ultraviolet LED is small. When the ultraviolet LED is used as the light source for resin curing, backlight or other applications, a number of the ultraviolet LEDs should be used. The ultraviolet light-emitting apparatus using a number of ultraviolet LEDs to enhance the intensity and including a light source being as compact as possible is known: Specifically, there is a ultraviolet light-emitting apparatus including a plurality of light-emitting diodes for emitting ultraviolet rays being arranged to form one planar surface and to space equally each other on a concentric circle from a main light axis of the apparatus, collimating optical systems arranged at light emission side corresponding to the light emitting diodes having the number same as those of the light-emitting diodes, and light source housings holding a plurality of the light-emitting diodes and a plurality of the collimating optical systems, in which one field lens for covering the collimating optical system is arrange directly after the next collimating optical system (see Patent Document 1).

Patent Document 1: Japanese Patent Application Laid-open No. 2005-203481

SUMMARY OF INVENTION

Problem to be Solved by the Invention

By the ultraviolet light-emitting apparatus disclosed in Patent Document 1, it is possible to decrease a size and a weight as well as to irradiate high intensity ultraviolet rays in a narrow region. However, in the ultraviolet light-emitting apparatus, the ultraviolet LEDs are arranged to form one planar surface and to space equally each other on a concentric circle from a main light axis of the apparatus. Therefore, if trying to increase the intensity of ultraviolet rays, a number of the ultraviolet LEDs should be arrayed coplanar, which inevitably grows in a planar size of the light source. Along therewith, the field lens necessary for condensing the ultraviolet rays should have undesirably a large diameter.

Means for Solving the Problem

The present invention solves the above-described problems by arranging and modularizing the ultraviolet LEDs for utilizing the space in the light source more effectively and by combining the modularized light source with a light condenser that effectively condenses the ultraviolet rays emitted from the light source in the ultraviolet irradiation apparatus.

Specifically, a first present invention is an ultraviolet light-emitting module characterized in that a plurality of ultraviolet light-emitting devices is disposed on a surface of a spherical or polyhedral base or on a side surface of a cylindrical or polygonal columnar base such that a light axis of each ultraviolet light-emitting device passes through a center of the spherical or polyhedral base or a light axis of each ultraviolet light-emitting device passes through a center axis of the cylindrical or polygonal columnar base to emit the ultraviolet rays radially to the center or the center axis.

A second present invention is an ultraviolet irradiation apparatus characterized by including: a light source for emitting ultraviolet rays; and a light condenser for condensing the ultraviolet rays emitted from the light source, the light source is a spherical light source where a plurality of ultraviolet light-emitting devices is disposed on a surface of a spherical or polyhedral base such that a light axis of each ultraviolet light-emitting device passes through a center of the spherical or polyhedral base to emit the ultraviolet rays radially to the center, or a rod-like light source where a plurality of ultraviolet light-emitting devices is disposed on a side surface of a cylindrical or polygonal columnar base such that a light axis of each ultraviolet light-emitting device passes through a center axis of the cylindrical or polygonal columnar base to emit the ultraviolet rays radially to the center axis.

In the ultraviolet irradiation apparatus of the present invention, a flow path for a cooling medium is preferably formed inside of the spherical or polyhedral base or the cylindrical or polygonal columnar base in the light source.

Also, in the ultraviolet irradiation apparatus of the present invention, the light condenser includes a emitted-side reflective mirror composed of a spheroidal reflective mirror or a long elliptical reflective mirror, when the emitted-side reflective mirror is the spheroidal reflective mirror, the spherical light source is disposed on a focal point, when the emitted-side reflective mirror is the long elliptical reflective mirror, the rod-like light source is disposed on a focal axis, and an opening for emitting ultraviolet rays is disposed near a light condensing point or a light condensing axis of the emitted-side reflective mirror.

Since a light-emitting efficiency can be high in the ultraviolet irradiation apparatus according to the above-described embodiment, it is especially preferable that the light condenser includes a spheroidal reflective mirror or a long elliptical reflective mirror having a same shape to that of the emitted-side reflective mirror, the light condenser includes a spheroidal reflective mirror or a long elliptical reflective mirror having a same shape to that of the emitted-side reflective mirror, a light-condensed-side reflective mirror having an opening for emitting ultraviolet rays near a focal point or a focal axis of the spheroidal reflective mirror or the long elliptical reflective mirror is further included, and the emitted-side reflective mirror and the light-condensed-side reflective mirror are faced and connected such that a light condensing point or a light condensing axis of the emitted-side reflective mirror are coincide with a focal point or a focal axis of the light-condensed-side reflective mirror.

Also, at the opening for emitting ultraviolet rays, "a collimating optical system for converting the ultraviolet rays condensed into parallel or substantially parallel light fluxes" or "a light incident unit of an optical transmitting system including a light incident unit for taking ultraviolet rays condensed by the light condenser, a transmission unit for transmitting the ultraviolet rays taken, and a light emission unit for emitting the ultraviolet rays transmitted" are preferably disposed.

Effect of the Invention

In the ultraviolet light-emitting module in the related art, there is need to dispose all light-emitting devices on a coplanar surface so that the light axes of the ultraviolet ray light-emitting devices are directed to the same direction. Therefore, a large area is necessary when the number of the ultraviolet light-emitting devices arrayed within the module is increased. In contrast, according to the ultraviolet light-emitting module of the present invention, a number of the ultraviolet light-emitting devices are arranged therein in order to enhance the light-emitting intensity. The ultraviolet light-emitting devices are arranged on a curved surface of a spherical or cylindrical base so as to radially emit the ultraviolet rays. In this manner, a space within the module can be effectively utilized, and the module can be downsized. Also, in the module of the present invention, the base is composed of a metal having a high thermal conductivity and a flow path for cooling medium is formed therein. By passing a cooling medium such as cooling water through the flow path, it is possible to effectively cool the heat radiated from the ultraviolet light-emitting devices. Further, the module of the present invention is covered with a cover formed by an ultraviolet transmitting material such as quartz. The cover is air-tightly or water-tightly mounted to the base using a sealing member. Inside thereof is filled with an inert gas such as nitrogen gas. In this manner, the ultraviolet light-emitting devices are prevented from degrading, and the device lives can be further prolonged.

In the ultraviolet light-emitting apparatus of the present invention, in principal, all ultraviolet rays emitted radially from the spherical or rod-like light source can be condensed on the focal axis of the light-condensed-side reflective mirror, and ultraviolet rays emitted not to the opening for emitting ultraviolet rays (for example, emitted to the opposite direction or the horizontal direction) can be effectively used. Accordingly, in the light source, the number of the ultraviolet light-emitting devices arranged per unit space can be significantly increased. In the ultraviolet light-emitting apparatus, the ultraviolet rays having higher intensities can be emitted. In addition, there is no need to use a field lens having a large diameter. Furthermore, in the ultraviolet light-emitting apparatus of the present invention, ultraviolet rays having uniform intensity can be irradiated not in a narrow spot irradiation area but in a long side rectangle area, and a surface area of the irradiated area and the ultraviolet intensity can be adjusted. As the ultraviolet rays can be emitted as parallel collimated light fluxes, the intensities are less likely to be decreased even if a distance to an object to be irradiated is long.

BRIEF DESCRIPTION OF DRAWINGS

FIG. 2 A transverse cross-sectional view of a typical ultraviolet light-emitting apparatus according to one embodiment of the present invention.

FIG. 3 A side view of a typical ultraviolet light-emitting apparatus according to one embodiment of the present invention.

MODE(S) FOR CARRYING OUT THE INVENTION

Figure 1:
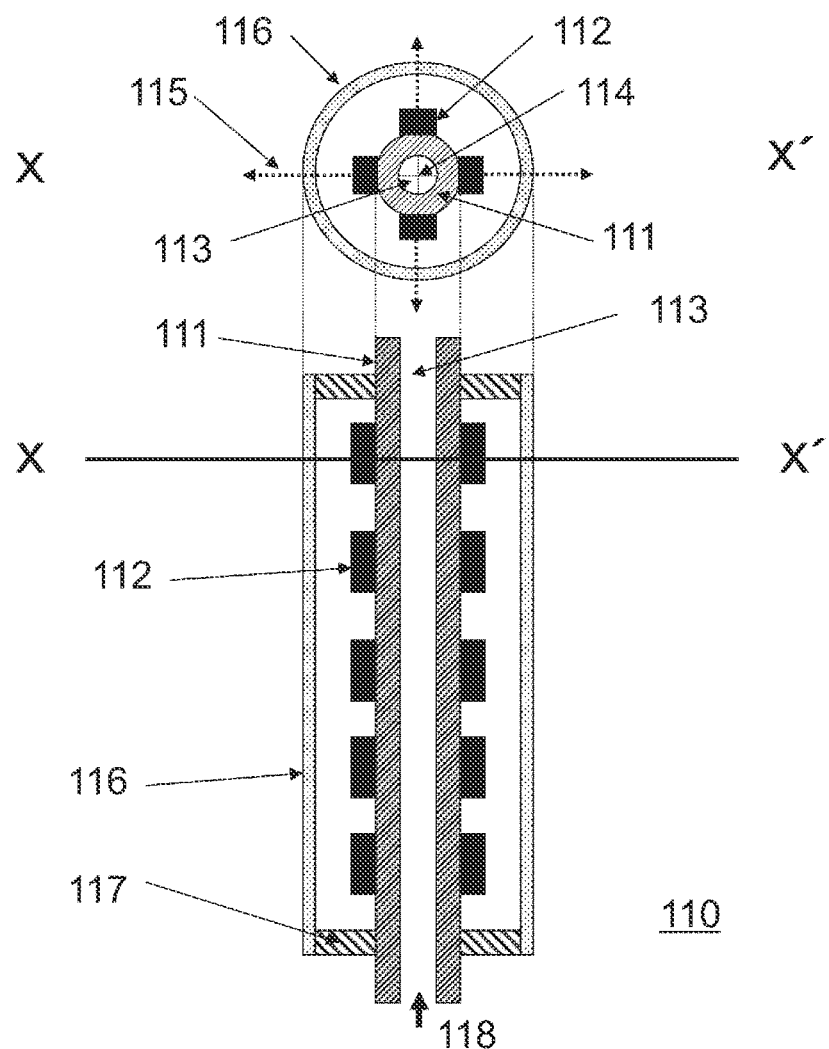
FIG. 1 A diagram showing transverse and longitudinal cross-sections of a typical rod-like light source (rod-like ultraviolet light-emitting module) used in one embodiment of the present invention.

A second present invention is an ultraviolet light-emitting module characterized by including: a light source for emitting ultraviolet rays; and a light condenser for condensing the ultraviolet rays emitted from the light source, the light source is a spherical light source where a plurality of ultraviolet light-emitting devices is disposed on a surface of a spherical or polyhedral base such that a light axis of each ultraviolet light-emitting device passes through a center of the spherical or polyhedral base to emit the ultraviolet rays radially to the center, or a rod-like light source where a plurality of ultraviolet light-emitting devices is disposed on a side surface of a cylindrical or polygonal columnar base such that a light axis of each ultraviolet light-emitting device passes through a center axis of the cylindrical or polygonal columnar base to emit the ultraviolet rays radially to the center axis.

Here, the spherical light source in the second present invention corresponds to "the ultraviolet light-emitting module using the spherical or polyhedral base as the base" in the first present invention, and the rod-like light source in the second present invention corresponds to "the ultraviolet light-emitting module using the spherical or polyhedral base as the base" in the first present invention. Accordingly, these modules will be described as the light sources in the ultraviolet irradiation apparatus of the present invention.

Hereinafter, the ultraviolet irradiation apparatus according to one embodiment of the present invention will be described by referring to the figures and illustrating an irradiation apparatus 100 using a rod-like light source (rod-like ultraviolet light-emitting module) 110.

FIG. 1 shows transverse and longitudinal sections (cut at X-X' section) of a rod-like light source (rod-like ultraviolet light-emitting module) 110. As shown in the figure, in the rod-like light source 110, a plurality of ultraviolet light-emitting devices 112 are arranged in line on a surface of a cylindrical base 111, and a flow path for cooling medium 113 is formed inside of the cylindrical base. The cylindrical base 111 to which the ultraviolet light-emitting devices 112 are mounted is covered with a cover 116 formed by an ultraviolet transmitting material such as quartz. The cover 116 is air-tightly or water-tightly mounted to the cylindrical base using a sealing member 117 such as an o-ring. Inside thereof is filled with an inert gas such as nitrogen or dry air gas. A desiccant (not shown) may be included within the cover in order to keep a water amount (humidity) to low. In this manner, the ultraviolet light-emitting device can have a high durability. The figure shows an embodiment where the cylindrical base, to which the ultraviolet light-emitting devices are mounted, is inserted using a quartz tube as the cover.

As the ultraviolet light-emitting devices 112, ultraviolet LEDs are suitably used. Principally for the reason that it is difficult to provide a high light-emitting efficiency and there is a great advantage of providing high intensity ultraviolet rays by applying to the ultraviolet light-emitting apparatus of the present invention, it is especially preferable that LEDs emitting deep ultraviolet (deep ultraviolet LEDs) are used. It is preferable that the ultraviolet LEDs are arranged in a state that the devices are mounted on a sub mount or in a state that they are housed in a package and that ultraviolet rays are preferably emitted in a constant direction. Although not shown, wiring for feeding electric power externally to ultraviolet light-emitting device, circuits for operating correctly the ultraviolet light-emitting devices and the like are formed on the sub mount or the package. Electrical power is fed to the wiring or the circuits via wiring formed on a surface of or inside of the cylindrical base 111.

The cylindrical base 111 functions not only as a support to fix and hold the ultraviolet light-emitting devices 112, but also as a heat sink. By passing a cooling medium 118 such as cooling water and cooling air through the flow path for cooling medium 113 inside, a temperature increase caused by heat radiation from the ultraviolet light-emitting devices is prevented so that the devices are operated stably and device lives are prolonged.

In the present invention, as a number of ultraviolet light-emitting devices are intimately mounted on the surface of the cylindrical base 111 as described later, it is especially important to remove efficiently heat generated at the ultraviolet light-emitting devices. Accordingly, the cylindrical base 111 is preferably mainly composed of a metal having a high thermal conductivity such as copper and aluminum and a ceramic. In addition, in order to increase a contact area of the cooling medium, it is preferable that an inner wall surface of the flow path for cooling medium is subjected to grooving. Further, when the cylindrical base 111 is composed of the metal material, it is preferable that an insulation layer is formed in order to insulate a copper wire or a circuit for feeding electrical power from an external power source to the ultraviolet light-emitting devices.

At a side surface of the cylindrical base 111, a plurality of the ultraviolet light-emitting devices 112 is arranged along a circumferential direction of the base such that extended lines of light axes 115 of the ultraviolet light-emitting devices 112 pass through the center axis 114 of the base 111 and light emitted surfaces are directed outwardly. As a result, ultraviolet rays emitted from the ultraviolet light-emitting devices are emitted radially from the center axis 114. Note that the light axes 115 of the ultraviolet light-emitting devices 112 mean center axes of light beams emitted from the ultraviolet light-emitting devices and are almost synonymous to travel directions of the light beams. Also, note that "arranged such that the light axes 115 pass through the center axis 114 of the base 111" means that such a status is realized as much as possible and the light axis 115 may be tilted slightly from the status.

FIG. 1 shows an example that four ultraviolet light-emitting devices are arranged in the circumferential direction of the base. But it is not limited thereto, and the arrangement can be changed depending on outer diameter of the cylindrical base 111, as appropriate. The number of the ultraviolet light-emitting devices arranged in the circumferential direction is generally 3 to 20, preferably 4 to 12. The higher the number of the ultraviolet light-emitting devices arranged in the circumferential direction is, the higher intensity of ultraviolet rays (photon flux density) emitted from the ultraviolet irradiation apparatus of the present invention is. When a higher intensity of the ultraviolet rays is needed, the diameter of the cylindrical base 111 may be larger and the number of the ultraviolet light-emitting devices arranged in the circumferential direction exceeding the range may be increased.

The ultraviolet light-emitting devices 112 are preferably arranged so as to form lines in a longitudinal direction of the cylindrical base 111 as shown in the longitudinal cross-sectional view in FIG. 1. The longer an arrangement length in the longitudinal direction is, the longer the length of an ultraviolet ray irradiation area is. At this time, the ultraviolet light-emitting devices are preferably arranged intimately and regularly so as to provide a uniform intensity in the ultraviolet ray irradiation area.

FIG. 2 and FIG. 3 show a transverse cross-sectional view and a longitudinal cross-sectional view of the ultraviolet light-emitting apparatus 100 according to one embodiment of the present invention. The ultraviolet light-emitting apparatus 100 has a main body 150 including a light-emitted-side housing 125 having inside a emitted-side reflective mirror 120 composed of a long elliptical reflective mirror, a light-condenser-side housing 126 having inside a light-condensed-side reflective mirror 123 composed of a long elliptical reflective mirror and having an opening for emitting ultraviolet rays 130, and a collimating optical system 140 disposed at the opening for emitting ultraviolet rays 130. Inside of the main body 150, the rod-like light source 110 is disposed. In the main body 150, it is preferable that the light-emitted-side housing 125 and the light-condensed-side housing can be mutually attached/detached or opened/closed using a hinge. At top and bottom openings on both sides of the main body 150 shown in FIG. 3, covers (not shown) for preventing ultraviolet rays from leaking to outside are disposed.

In the embodiment shown in the figures, as the emitted-side reflective mirror 120 and the light-condensed-side reflective mirror 123 are the long elliptical reflective mirrors having substantially same shapes, an inner space formed by binding the light-emitted-side housing 125 and the light-condensed-side housing 126 in the main body 150 has a columnar shape having an ellipse cross-section where focal axes are a focal axis 121 of the emitted-side reflective mirror and a light condensing axis 122 of the emitted-side reflective mirror (note that a part corresponding to the opening 130 is missing). Surfaces of the emitted-side reflective mirror 120 and the light-condensed-side reflective mirror 123 are preferably composed of a material having a great reflectance to ultraviolet rays, e.g., a platinum group metal such as Ru, Rh, Pd, Os, Ir and Pt; Al, Ag, Ti; an alloy containing at least one of these metals; barium sulfate; or magnesium oxide. On the basis that the reflectance is especially high, it is especially preferable that they are formed of Al, a platinum group metal, an alloy containing the platinum group metal, barium sulfate or magnesium oxide. When they are composed of the metal material, in order to prevent surfaces from oxidizing or scratching and the reflectance from decreasing, it is preferable that the surfaces are coated with an ultraviolet transmitting material such as quartz and an ultraviolet transmitting dielectric.

At the light-condensed-side reflective mirror 123 and the light-condensed-side housing 126, the opening for emitting ultraviolet rays 130 is disposed as a slit. At the opening, the collimating optical system 140 for converting ultraviolet rays condensed into parallel or substantially parallel light fluxes. Preferably, the collimating optical system 140 is composed of a material having high ultraviolet transmitting properties such as synthesized or natural quartz, sapphire and an ultraviolet transmitting resin. The collimating optical system 140 is preferably attached detachably to the opening for emitting ultraviolet rays 130. In the figure, as the collimating optical system, one cylindrical planar convex lens is used, but it is not limited thereto. Alternatively, a plurality of collimating optical systems for converting into parallel light fluxes having mutually different predetermined photon flux densities or parallel light fluxes having mutually different predetermined irradiated areas may be prepared, one of a plurality of the collimating optical systems may be disposed switchably at the opening for emitting ultraviolet rays, and may adjust the photon flux densities or the irradiated areas of the ultraviolet light fluxes emitted from the ultraviolet irradiation apparatus.

For example, a plurality of lenses may be combined and disposed at a front of the cylindrical planar convex lens (light proceeding direction side) to construct a beam expander. In addition, attachments that are cut into round slices from a part of the light-condensed-side reflective mirror 123 and the light-condensed-side housing 126 each having a wider opening fitting to the opening for emitting ultraviolet rays 130 and a narrower opening fitting to the collimating optical system 140 are prepared in accordance with the collimating systems having different widths, respectively. A plurality of assemblies is produced by combining the respective attachments and collimating systems. By attaching interchangeably the assemblies to the opening for emitting ultraviolet rays 130, such adjustment can be made.

In the ultraviolet light-emitting apparatus 100, the rod-like light source 110 is disposed such that the center axis 114 is coincide with the focal axis 121 of the emitted-side reflective mirror. As the rod-like light source 110 is disposed at the position, the ultraviolet rays emitted radially from the rod-like light source 110 is reflected at the emitted-side reflective mirror and the light-condensed-side reflective mirror and is condensed converging on the focal axis of the light-condensed-side reflective mirror. The ultraviolet rays condensed are emitted from the opening for emitting ultraviolet rays 130 to outside.

Thus, in the ultraviolet light-emitting apparatus 100, in principal, all ultraviolet rays emitted radially from the rod-like light source 110 can be condensed on the focal axis of the light-condensed-side reflective mirror, and ultraviolet rays emitted not to the opening for emitting ultraviolet rays 130 (for example, emitted to the opposite direction or the horizontal direction) can be effectively used. In other words, there is no need to dispose all light-emitting devices on a coplanar surface so that the light axes are directed to the opening for emitting ultraviolet rays 130, and the light-emitting devices can be disposed in the horizontal direction or the opposite direction. Accordingly, in the rod-like light source 110, the number of the ultraviolet light-emitting devices arranged per unit space can be significantly increased. In the ultraviolet light-emitting apparatus 100, the ultraviolet rays having higher intensities can be emitted. In addition, in the ultraviolet light-emitting apparatus 100, there is no need to use a field lens having a large diameter. Furthermore, in the ultraviolet light-emitting apparatus 100, ultraviolet rays having uniform intensity can be irradiated not in a narrow spot irradiation area but in a long side rectangle area, and a surface area of the irradiated area and the ultraviolet intensity can be adjusted. As the ultraviolet rays can be emitted as parallel collimated light fluxes, the intensities are less likely to be decreased even if a distance to an object to be irradiated is long.

While the ultraviolet light-emitting apparatus 100 shown in the figures have been illustrated, it should be understood that the ultraviolet light-emitting apparatus of the present invention is not limited thereto. For example, any light-condensed-side reflective mirror having a shape different from the long elliptical reflective mirror used as the emitted-side reflective mirror can be used as long as the ultraviolet rays are reflected to the light-emitted-side reflective mirror without leaking the ultraviolet rays to outside. Instead of the collimating optical system, "an optical transmitting system including a light incident unit for taking ultraviolet rays condensed, a transmission unit for transmitting the ultraviolet rays taken, and a light emission unit for emitting the ultraviolet rays transmitted" may be used.

Instead of the rod-like light source, a spherical light source where a plurality of ultraviolet light-emitting devices is disposed on a surface of a spherical or polyhedral base such that a light axis of each ultraviolet light-emitting device passes through a center of the spherical or polyhedral base to emit the ultraviolet rays radially to the center may be used, and the emitted-side reflective mirror and the light-condensed-side reflective mirror may be spheroidal reflective mirrors. In this case, the inner space of the main body has an oval sphere shape, the light source is disposed at the focal position of the oval sphere reflective mirror as the emitted-side reflective mirror, and the ultraviolet rays are condensed converging on the focal axis of the oval sphere reflective mirror as the emitted-side reflective mirror. Accordingly, the opening for emitting ultraviolet rays has not a slit shape but a circle shape. For the collimating system, a planar convex lens is suitably used.

DESCRIPTION OF REFERENCE NUMERALS

100 ultraviolet light-emitting apparatus
110 rod-like light source
111 cylindrical base
112 ultraviolet light-emitting device
113 flow path for cooling medium
114 center axis of cylindrical base
115 light axis of ultraviolet light-emitting device
116 cover
117 seal member
118 cooling medium
120 light-emitted-side reflective mirror composed of long elliptical reflective mirror
121 focal axis of light-emitted-side reflective mirror
122 light condensing axis of light-emitted-side reflective mirror
123 light-condensed-side reflective mirror composed of long elliptical reflective mirror
124 focal axis of light-condensed-side reflective mirror
125 light-emitted-side housing
126 light-condensed-side housing
130 opening for emitting ultraviolet
140 collimating optical system
150 main body

The invention claimed is:

1. An ultraviolet light-emitting module characterized by comprising:
   a base where a plurality of ultraviolet light-emitting devices are disposed on a side surface of a cylindrical or polygonal columnar base such that a light axis of each ultraviolet light-emitting device passes through a center axis of the cylindrical or polygonal columnar base to emit ultraviolet rays radially to the center axis;
   a cover formed by an ultraviolet transmitting material,
   the cover covering the base where the ultraviolet light-emitting devices are disposed and being air-tightly mounted to the base where the ultraviolet light-emitting devices are disposed such that inside thereof is filled with an inert gas or dried air; and
   a flow path for a cooling medium formed inside of the cylindrical or polygonal columnar base to flow a cooling medium through the flow path for a cooling medium.

2. An ultraviolet irradiation apparatus characterized by comprising:
   a light source for emitting ultraviolet rays; and
   a light condenser for condensing the ultraviolet rays emitted from the light source,
   the light source is a spherical light source where a plurality of ultraviolet light-emitting devices are disposed on a surface of a spherical or polyhedral base such that a light axis of each ultraviolet light-emitting device passes through a center of the spherical or polyhedral base to emit the ultraviolet rays radially to the center, or a rod-like light source where a plurality of ultraviolet light-emitting devices are disposed on a side surface of a cylindrical or polygonal columnar base such that a light axis of each ultraviolet light-emitting device passes through a center axis of the cylindrical or polygonal columnar base to emit the ultraviolet rays radially to the center axis.

3. The ultraviolet irradiation apparatus according to claim 2, characterized in that the rod-like light source includes an ultraviolet light-emitting module, comprising:

a base where a plurality of ultraviolet light-emitting devices is disposed on a side surface of a cylindrical or columnar base such that a light axis of each ultraviolet light-emitting device passes through a center axis of the cylindrical or polygonal columnar base to emit ultraviolet rays radially to the center axis;

a cover formed by an ultraviolet transmitting material, the cover covering the base where the ultraviolet light-emitting devices is disposed and being air-tightly mounted to the base where the ultraviolet light-emitting devices are disposed such that inside thereof is filled with an inert gas or dried air; and a flow path for a cooling medium formed inside of the cylindrical or polygonal columnar base to flow a cooling medium through the flow path for a cooling medium.

4. The ultraviolet irradiation apparatus according to claim 3, characterized in that the light condenser includes an emitted-side reflective mirror composed of a long elliptical reflective mirror, the rod-like light source is disposed on a focal axis of the emitted-side reflective mirror, and an opening for emitting ultraviolet rays is disposed near a light condensing point of the emitted-side reflective mirror.

5. The ultraviolet irradiation apparatus according to claim 2, characterized in that the light condenser includes a emitted-side reflective mirror composed of a spheroidal reflective mirror or a long elliptical reflective mirror, when the emitted-side reflective mirror is the spheroidal reflective mirror, the spherical light source is disposed on a focal point, when the emitted-side reflective mirror is the long elliptical reflective mirror, the rod-like light source is disposed on a focal axis, and an opening for emitting ultraviolet rays is disposed near a light condensing point or a light condensing axis of the emitted-side reflective mirror.

6. The ultraviolet irradiation apparatus according to claim 5, characterized in that the light condenser includes a spheroidal reflective mirror or a long elliptical reflective mirror having a same shape to that of the emitted-side reflective mirror, a light-condensed-side reflective mirror having an opening for emitting ultraviolet rays near a focal point of the spheroidal reflective mirror or a focal axis of the long elliptical reflective mirror is further included, and the emitted-side reflective mirror and the light-condensed-side reflective mirror are faced and connected such that a light condensing point or a light condensing axis of the emitted-side reflective mirror are coincide with a focal point or a focal axis of the light-condensed-side reflective mirror.

7. The ultraviolet irradiation apparatus according to claim 5, characterized in that a collimating optical system for converting ultraviolet rays condensed into parallel or substantially parallel light fluxes is disposed at the opening for emitting ultraviolet rays.

8. The ultraviolet irradiation apparatus according to claim 7, characterized in that a plurality of collimating optical systems for converting ultraviolet rays condensed into parallel light fluxes having mutually different predetermined photon flux densities or parallel light fluxes having mutually different predetermined irradiated areas is included, one of a plurality of the collimating optical systems is disposed switchably at the opening for emitting ultraviolet rays, and is configured to adjust the photon flux densities or the irradiated areas of the ultraviolet light fluxes emitted from the ultraviolet irradiation apparatus.

9. The ultraviolet irradiation apparatus according to claim 5, characterized in that an optical transmitting system including a light incident unit for taking ultraviolet rays condensed by the light condenser, a transmission unit for transmitting the ultraviolet rays taken, and a light emission unit for emitting the ultraviolet rays transmitted is further included, and the light incident unit of the optical transmitting system is disposed at the opening for emitting ultraviolet rays.

* * * * *